(12) United States Patent
Trifonov et al.

(10) Patent No.: US 7,605,646 B2
(45) Date of Patent: Oct. 20, 2009

(54) LOW GLITCH OFFSET CORRECTION CIRCUIT FOR AUTO-ZERO SENSOR AMPLIFIERS AND METHOD

(75) Inventors: Dimitar T. Trifonov, Vail, AZ (US);
Tony R. Larson, Tucson, AZ (US);
Jerry L. Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 38 days.

(21) Appl. No.: 11/890,204

(22) Filed: Aug. 3, 2007

(65) Prior Publication Data

US 2009/0009239 A1    Jan. 8, 2009

Related U.S. Application Data

(60) Provisional application No. 60/948,239, filed on Jul. 6, 2007, provisional application No. 60/959,864, filed on Jul. 17, 2007.

(51) Int. Cl.
*H03F 1/02* (2006.01)
(52) U.S. Cl. .......................................... 330/9
(58) Field of Classification Search .................... 330/9; 327/124, 307
See application file for complete search history.

(56) References Cited

U.S. PATENT DOCUMENTS

| 7,132,883 B2* | 11/2006 | Huijsing et al. | 330/9 |
| 7,292,095 B2* | 11/2007 | Burt et al. | 330/9 |
| 7,382,183 B2* | 6/2008 | Nolan et al. | 330/9 |

* cited by examiner

*Primary Examiner*—Steven J Mottola
(74) *Attorney, Agent, or Firm*—John J. Patti; Wade J. Brady, III; Frederick J. Telecky, Jr.

(57) ABSTRACT

An instrumentation amplifier includes first (11A) and second (12A) input amplifiers having outputs (15A,B) coupled to an output amplifier (13). A first auto-zero stage (20) in the first input amplifier is auto-zeroed to a first voltage level ($V_{REFL}$), a first input signal ($Vin^+$) is amplified by a second auto-zero stage (24) in the first input amplifier, and the amplified first input signal is coupled to the output amplifier, during a first phase (A). A third auto-zero stage (44) in the second input amplifier is auto-zeroed to a second voltage level ($V_{REFH}$), a second input signal ($Vin^-$) is amplified by a fourth auto-zero stage (40) in the second input amplifier, and the amplified second input signal is coupled to the output amplifier, during a second phase (B). The second auto-zero stage is auto-zeroed to the first voltage level, the first input signal is amplified by the first auto-zero stage (20), and the amplified first input signal is coupled to the output amplifier, during a third phase (C). The fourth auto-zero stage is auto-zeroed to a the second voltage level, the second input signal is amplified by the third auto-zero stage, and the amplified second input signal is coupled to the output amplifier, during a fourth phase (D).

20 Claims, 6 Drawing Sheets

LOW GLITCH OFFSET CORRECTION CIRCUIT FOR AUTO-ZERO SENSOR AMPLIFIERS AND METHOD

CROSS REFERENCE TO RELATED APPLICATION

This application claims the benefit of a first prior filed co-pending U.S. provisional application Ser. No. 60/948,239 filed Jul. 6, 2007, entitled "Low Glitch Offset Correction Circuit for Auto-Zero Sensor Amplifiers", by Dimitar Trifonov, Tony Ray Larson, and Jerry L. Doorenbos, and incorporated herein by reference.

This application also claims the benefit of a second prior filed co-pending U.S. provisional application Ser. No. 60/959,864, filed Jul. 17, 2007, entitled "Low Glitch Offset Correction Circuit for Auto-zero Sensor Amplifiers and Method", by Dimitar T. Trifonov, Tony R. Larson, and Jerry L. Doorenbos, and incorporated herein by reference.

BACKGROUND OF THE INVENTION

This invention relates to integrated auto-zero instrumentation amplifiers and instrumentation amplifier circuitry incorporating programmable input offset voltage correction circuits.

Figure 1:
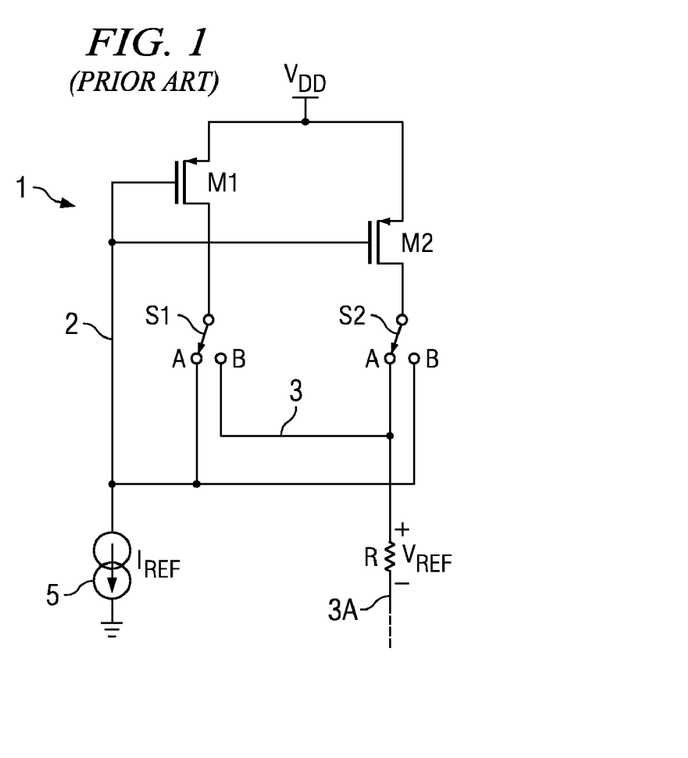
FIG. 1 is a schematic drawing of a conventional 2-phase chopped offset voltage reference circuit.

FIG. 1 shows a 2-phase chopped voltage reference circuit 1 which includes a current source 5 that generates a reference current $I_{REF}$. A current source 5 is coupled between ground and a conductor 2 which is connected to the gates of P-channel transistors M1 and M2. The sources of transistors M1 and M2 are connected to $V_{DD}$. The drain of transistor M1 is connected to the pole of a switch S1. During an "A" phase, the pole of switch S1 is connected to conductor 2. The drain of transistor M2 is connected to the pole of a switch S2. During the "A" phase, the pole of switch S2 is connected to a conductor 3 which is connected to a first terminal of a resistor R. Conductor 2 also is connected to a terminal of switch S2 to which the drain of transistor M2 is coupled by the pole of switch S2 during a "B" phase. Conductor 3 also is connected to a terminal of switch S1 to which the drain of transistor M1 is coupled by the pole of switch S1 during the "A" phase. The second terminal 3A of resistor R is connected to circuitry that receives a switched current which flows through either transistor M1 during phase "B" or transistor M2 during phase "B".

Figure 1A:
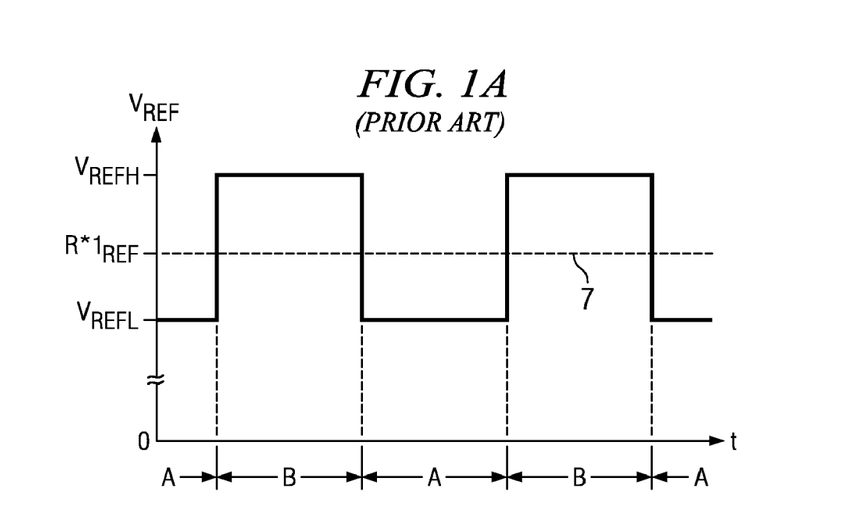
FIG. 1A is a timing diagram illustrating the voltage $V_{DD}$ developed across resistor R in FIG. 1.

FIG. 1A shows a waveform of the voltage $V_{REF}$ developed across resistor R by the currents from transistors M1 and M2 that are switched through resistor R by switches S1 and S2, respectively. Switches S1 and S2 are both controlled in response to a square wave signal at the desired chopping frequency. The illustrated "ripple" of the square wave $V_{REF}$ waveform with upper voltage levels of $V_{REFH}$ and lower voltage levels of $V_{REFL}$ shown in FIG. 1A is caused by normal mismatches between transistors M1 and M2. The average value of the $V_{REF}$ waveform is indicated by the dashed horizontal line 7.

Figure 2:
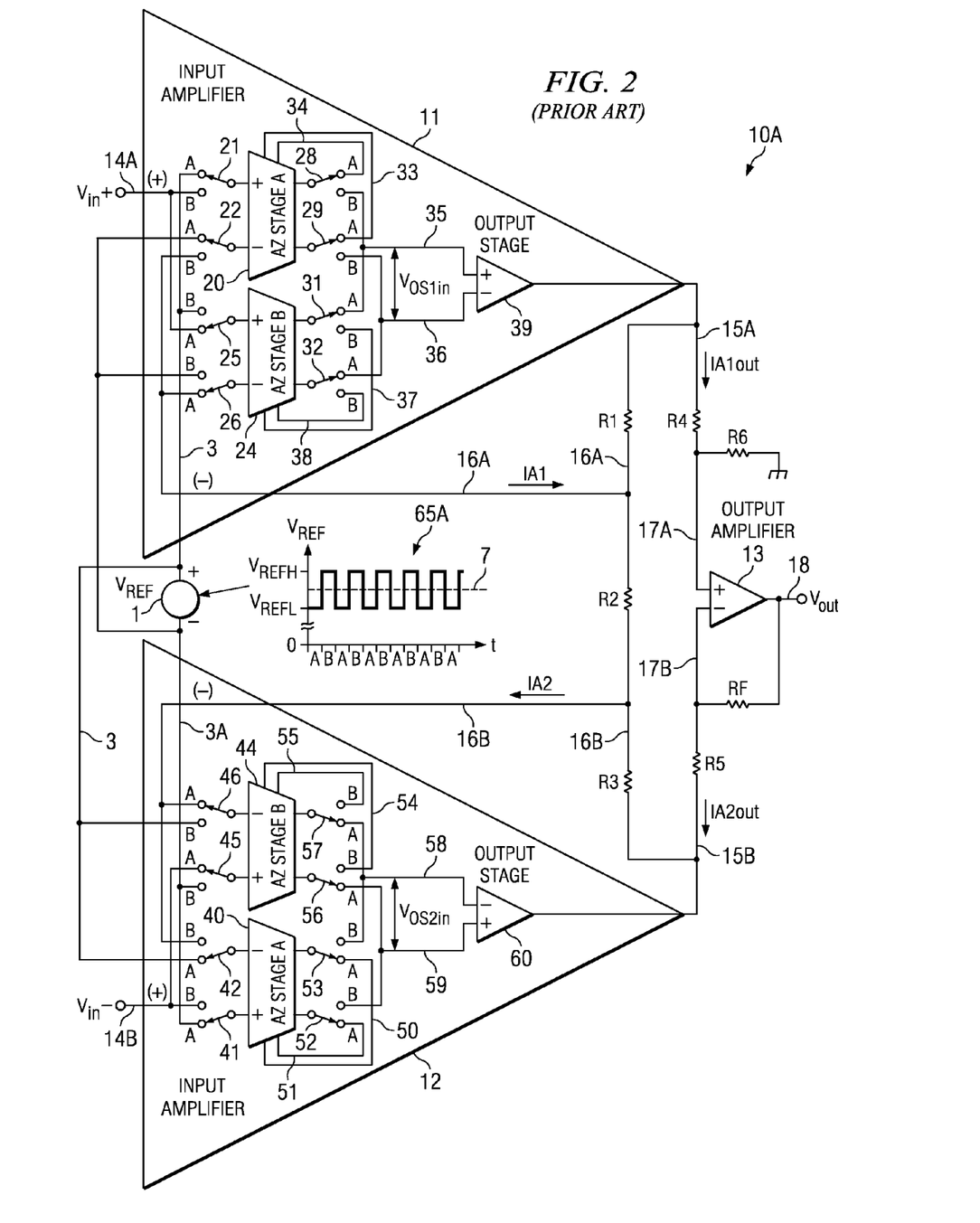
FIG. 2 is a block diagram of a prior art 2-phase auto-zeroing instrumentation amplifier using an offset voltage reference of the kind shown in FIG. 1.

Referring to FIG. 2, two-phase auto-zeroing instrumentation amplifier 10A includes a first input amplifier 11 having a (+) input coupled by input conductor 14A to receive input signal Vin$^+$, a (−) input coupled to conductor 16A, and an output 15A coupled by a resistor R1 to conductor 16A. Instrumentation amplifier 10A also includes a second input amplifier 12 having a (+) input coupled by input conductor 14B to receive input signal Vin$^−$, a (−) input coupled to conductor 16B, and an output 15B coupled by a resistor R3 to conductor 16B. A resistor R2 is connected between conductors 16A and 16B.

Instrumentation amplifier 10A also includes an output amplifier 13 having a (+) input connected by a conductor 17A to one terminal of a resistor R4 having its opposite terminal connected to output 15A of input amplifier 11 and also connected to one terminal of a resistor R6 having its opposite terminal connected to an AC ground. Output amplifier 13 also has a (−) input connected by a conductor 17B to one terminal of a resistor R5 having its opposite terminal connected to output conductor 15B of input amplifier 12. The (−) input of output amplifier 13 also is connected to one terminal of feedback resistor $R_F$, the opposite terminal of which is connected to an output 18 of output amplifier 13. An output voltage Vout is produced on conductor 18 of output amplifier 13.

Instrumentation amplifier 10A also includes a two-phase chopped voltage reference circuit 1 that can be similar or identical to the one shown in FIG. 1, having a (+) terminal connected by conductor 3 to input amplifier 11 and a (−) terminal connected by conductor 3A to input amplifier 12.

All of the switches in FIG. 2 are illustrated as being set to the states they assume during the "A" phase of the auto-zero cycle of instrumentation amplifier 10A. It may be seen that during the auto-zeroing phase of instrumentation amplifier 10A, the two auto-zero stages labeled "A" are in their auto-zero calibration mode whereas the auto-zero stages labeled B are in a signal passing mode wherein they pass signals on to their respective output stages (i.e., output stage 39 or output stage 60). Therefore, during the "A" phase, the "A" auto-zero stage outputs are at a voltage level which is a function of $V_{REF}$, mismatches between the input transistors of the auto-zero stage, and by other factors as well. Since it is desirable to minimize the transconductance gm of the input transistors of the auto-zero calibration inputs of the input amplifiers, this output voltage level may be of a substantial and significant magnitude. (Each of the conventional auto-zero stages includes a calibration input stage (in parallel with a standard input stage) including calibration input transistors and also capacitors (not shown) to hold an offset voltage. The outputs of the auto-zero stage are fed back to the "calibration inputs" to perform the function of "zeroing" the auto-zero stage. When the input switches associated with the auto-zero stages open, the capacitors therein hold the inputs of the auto-zero stages at the voltages thereon immediately prior to the instants at which the switches are opened.) Later, when the "B" phase begins, the "A" auto-zero stage outputs will be connected to the output stage 39 or 60, and the output voltage level of each auto-zero stage will change to a level that is a function of the amplified input signal Vin=Vin$^+$−Vin$^−$. A transient voltage "glitch" or spike produced by the illustrated switching arrangement therefore is both mismatch-dependent and signal-dependent.

In prior art instrumentation amplifier 10A of FIG. 2, the two auto-zero stages labeled "A" are auto-zeroed to the reference voltage $V_{REF}$ during time period A, while the two auto-zero stages labeled "B" are auto-zeroed during time period B to the reference voltage $V_{REF}$ produced by chopped voltage reference circuit 1. Thus, a complete auto-zero cycle occurs during the same time period as a complete two-phase reference circuit chopping cycle.

Prior Art instrumentation amplifier 10A calibrates one of the auto-zero stages in each of input amplifiers 11 and 12 during time period A and calibrates the other auto-zero stage during time period B. Therefore, the two auto-zero stages contained in each input amplifier of instrumentation amplifier 10A are always calibrated to the reference voltage $V_{REF}$ when they are in alternate states. This causes the input amplifier output signals on conductors 15A and 15B to vary in accordance with the chopped voltage reference levels. Furthermore, these variations and the above mentioned errors reinforce each other at the input of output amplifier 13 and produce a voltage glitch signal twice as large as either input amplifier 11 or 12 alone would produce.

Consequently, prior art instrumentation amplifiers such as the one shown in FIG. 2 (which is included in the assignee's PGA309 sensor amplifier) exhibit relatively large output voltage glitches that limit their usefulness. The voltage glitches referred to originate from various sources related to the switching nature of auto-zero circuits and chopped current circuits.

Several of the problems causing the various problematic output glitches of prior art instrumentation amplifier 10A of FIG. 2 are addressed by the subsequently described invention. The first problem of the prior art instrumentation amplifier 10A in FIG. 2 is a "clock feed-through glitch" that originates from the alternating level of reference voltage $V_{REF}$ produced by chopped reference voltage circuits of the kind shown in FIG. 1. Auto-zero circuits with input offset correction require a low drift voltage reference to allow accurate input offset calibration. Chopped voltage reference sources such as the one illustrated in FIG. 1 are used to provide low drift floating reference voltage signals. It is known that these chopped voltage reference circuits have accurate and stable average output values with very low long term drift and very low long term thermal drift. However, they produce slightly alternating output signal levels that vary at the chopping frequency around the average output value, due to normal device mismatches in the chopped current mirror including transistors M1 and M2. An offset correcting amplifier using such a chopped current reference circuit to produce its input offset reference therefore will calibrate its auto-zero input stages to the high and low alternating reference voltage values $V_{REFH}$ and $V_{REFL}$. Consequently, the alternating reference values ultimately appear as signal variations when the auto-zero stages are in their amplifying mode. The signal variations are amplified and then manifest themselves as undesired voltage glitches at the amplifier output, with amplitudes proportional to the reference variations and with a frequency equal to the chopping frequency. Unlike most voltage glitches associated with auto-zero amplifiers which are fast transient voltage spikes, the above mentioned "clock feed-through glitch" produces an alternating square-wave-like error at the clock frequency, superimposed on the output signal. The nature of this glitch makes it difficult to filter, and therefore limits the usability of the instrumentation amplifier configuration shown in FIG. 2 in many applications.

A second problem of the prior art is auto-zero stage offset-dependent charge error. This charge error is introduced when the input auto-zero stages connected to the inputs of output stages 39 and 60 are alternated in input amplifiers 11 and 12, as a result of mismatches between the input offset voltages of the switched auto-zero stages being alternated.

A related third problem of the prior art is a disturbance that is propagated through output amplifier 13 to Vout each time the inputs of output stage 39 or 60 are connected to one of the auto-zero stages. This occurs because some capacitively coupled glitch energy reaches the input of output amplifier 13 each time a switch changes state and couples charge onto the signal path. Output amplifier 13 drives the output node 18 in response to these disturbances and produces an output error in Vout its until the feedback arrangement drives all affected circuit nodes back to their proper levels. A limited loop bandwidth can result in relatively long-lasting output errors in response to even very short transient voltage glitches across the input terminals of output amplifier 13.

Thus, there is an unmet need for a programmable offset-canceling instrumentation amplifier and method that produces very low-noise switching glitches and very low clock feed-through glitches.

There also is an unmet need for an offset-canceling instrumentation amplifier which substantially eliminates various voltage glitch signals characteristic of the prior art auto-zero instrumentation amplifiers.

There also is an unmet need for an offset-canceling auto-zero instrumentation amplifier which substantially eliminates the clock feed-through glitch voltages characteristic of the prior art auto-zero instrumentation amplifiers.

There also is an unmet need for an offset-canceling auto-zero instrumentation amplifier which substantially eliminates the effect of slightly alternating output signal levels of chopped current reference voltage circuits used in the prior art auto-zero instrumentation amplifiers.

There also is an unmet need for an offset-canceling auto-zero instrumentation amplifier which substantially eliminates the effects of offset-dependent charge error characteristics of the prior art auto-zero instrumentation amplifiers.

There also is an unmet need for an offset-canceling auto-zero instrumentation amplifier which substantially eliminates the effects of glitch energy that is produced and transferred to the instrumentation amplifier output each time switches associated with auto-zero stages change state in the prior art auto-zero instrumentation amplifiers.

SUMMARY OF THE INVENTION

It is an object of the invention to provide a programmable offset-canceling instrumentation amplifier and method that produces very low-noise switching glitches and clock feed-through glitches.

It is another object of the invention to provide an offset-canceling auto-zero instrumentation amplifier which substantially eliminates various voltage glitch signals characteristic of the prior art auto-zero instrumentation amplifiers.

It is another object of the invention to provide an offset-canceling auto-zero instrumentation amplifier which substantially eliminates the clock feed-through glitch voltages characteristic of the prior art auto-zero instrumentation amplifiers.

It is another object of the invention to provide an offset-canceling auto-zero instrumentation amplifier which substantially eliminates the effect of slightly alternating output signal levels of chopped current reference voltage circuits used in the prior art auto-zero instrumentation amplifiers.

It is another object of the invention to provide an offset-canceling auto-zero instrumentation amplifier which substantially eliminates the effects of offset-dependent charge error characteristic of the prior art auto-zero instrumentation amplifiers.

It is another object of the invention to provide an offset-canceling auto-zero instrumentation amplifier which substantially eliminates the effects of glitch energy that is produced and transferred to the instrumentation amplifier output each time switches associated with auto-zero stages change state in the prior art auto-zero instrumentation amplifiers.

Briefly described, and in accordance with one embodiment, the present invention provides an instrumentation circuitry that includes a first input amplifier (11A) having a first input receiving a first input signal (Vin$^+$), an output (15A) coupled by a gain circuit to a first input of an output amplifier (13), and a second input receiving a first feedback signal (16A) from the gain circuit, and a second input amplifier (12A) having a first input receiving a second input signal (Vin⁻), an output (15B) coupled by the gain circuit to a second input of the output amplifier, and a second input receiving a second feedback signal (16B) from the gain circuit. A first auto-zero stage (20) in the first input amplifier is auto-zeroed to a first voltage level ($V_{REFL}$), the first input signal is amplified by a second auto-zero stage (24) in the first input amplifier, and the amplified first input signal is coupled to the first input of the output amplifier, during a first phase (A). A third auto-zero stage (44) in the second input amplifier is auto-zeroed to a second voltage level ($V_{REFH}$), the second input signal is amplified by a fourth auto-zero stage (40), and the amplified second input signal is coupled to the second input of the output amplifier, during a second phase (B). The second auto-zero stage is auto-zeroed to the first voltage level, the first input signal is amplified by the first auto-zero stage (20), and the amplified first input signal is coupled to the first input of the output amplifier, during a third phase (C). The fourth auto-zero stage is auto-zeroed to a the second voltage level, the second input signal is amplified by the third auto-zero stage, and the amplified second input signal is coupled to the first input of the output amplifier, during a fourth phase (D).

In one embodiment, the invention provides instrumentation amplifier circuitry (10B) including first (11A) and second (12A) input amplifiers each having a first input, a second input, and an output (15A,B), a chopped voltage reference circuit (1A) producing alternating first ($V_{REFL}$) and second ($V_{REFH}$) reference voltage levels on first (3) and second (3A) terminals thereof, an output amplifier (13) having first and second input terminals and an output terminal (18), and gain circuitry (R1,R2,R3) coupling the outputs (15A,B) of the first (11A) and second (12A) input amplifiers to the first and second inputs, respectively, of the output amplifier (13). First (20) and second (24) auto-zero stages, first (21), second (22), third (25) and fourth (26) input switches, and first (28), second (29), third (31) and fourth (32) output switches are included in the first input amplifier (11A). Third (40) and fourth (44) auto-zero stages, fifth (41), sixth (42), seventh (45) and eighth (46) input switches, and fifth (52A), sixth (53A), seventh (56A) and eighth (57A) output switches are included in the second input amplifier (12A). A control circuit (70) generates various control signals to control the chopped voltage reference circuit (1A), various input switches, and various output switches and operates the various input switches and the various output switches during first (A), second (B), third (C) and fourth (D) phases so as to auto-zero the first auto-zero stage (20) to the first voltage level ($V_{REFL}$) during the first phase (A), auto-zero the third auto-zero stage (44) to the second voltage level ($V_{REFH}$) during the second phase (B), auto-zero the second auto-zero stage (24) to the first voltage level ($V_{REFL}$) during the third phase (C), and auto-zero the fourth auto-zero stage (40) to the second voltage level ($V_{REFH}$) during the fourth phase (D).

In a described embodiment, the control circuit (70) also operates the various output switches to amplify the first input signal (Vin⁺) by means of the second auto-zero stage (24) and couple the amplified first input signal (Vin⁺) to the first input of the output amplifier (13) during the first phase (A), to amplify the second input signal (Vin⁻) by means of the fourth auto-zero stage (40) and couple the amplified second input signal (Vin⁻) to the second input of the output amplifier (13) during the second phase (B), to amplify the first input signal (Vin⁺) by means of the first auto-zero stage (20) and couple the amplified first input signal (Vin⁺) to the first input of the output amplifier (13) during the third phase (C), and amplify the second input signal (Vin⁻) by means of the third auto-zero stage (44) and couple the amplified second input signal (Vin⁻) to the first input of the output amplifier (13) during the fourth phase (D). The first input of the first input amplifier (11A) is coupled to receive a first input signal (Vin⁺) and the first input of the second input amplifier (12A) is coupled to receive a second input signal (Vin⁻), and wherein the first input switch (21) selectively couples the first input of the first auto-zero stage (20) to the first input signal (Vin⁺) or the first terminal (3) of the chopped reference voltage circuit (1A), and wherein the second input switch (22) selectively couples the second input of the first auto-zero stage (20) to the second terminal (3A) of the chopped reference voltage circuit (1A) or to a first feedback conductor (16A) of the gain circuitry (R1,R2,R3), and wherein the third input switch (25) selectively couples the first input of the second auto-zero stage (24) to the first input signal (Vin⁺) or the first terminal (3) of the chopped reference voltage circuit (1A), and wherein the fourth input switch (26) selectively couples the second input of the second auto-zero stage (24) to the second terminal (3A) of the chopped reference voltage circuit (1A) or to the first feedback conductor (16A) of the gain circuitry (R1,R2,R3). The fifth input switch (41) selectively couples the first input of the third auto-zero stage (40) to the second input signal (Vin⁻) or the second terminal (3A) of the chopped reference voltage circuit (1A), and wherein the sixth input switch (42) selectively couples the second input of the third auto-zero stage (40) to the first terminal (3) of the chopped reference voltage circuit (1A) or to a second feedback conductor (16B) of the gain circuitry (R1,R2,R3), and wherein the seventh input switch (45) selectively couples the first input of the fourth auto-zero stage (44) to the second input signal (Vin⁻) or the second terminal (3A) of the chopped reference voltage circuit (1A), and wherein the eighth input switch (46) selectively couples the second input of the fourth auto-zero stage (44) to the first terminal (3) of the chopped reference voltage circuit (1A) or to the second feedback conductor (16B) of the gain circuitry (R1,R2,R3).

In a described embodiment, the first output switch (28) selectively couples the first output of the first auto-zero stage (20) to a first auto-zero calibration input of the first auto-zero stage (20) or to a first input of a first output stage (39) in the first input amplifier (11A), and wherein the second output switch (29) selectively couples the second output of the first auto-zero stage (20) to a second auto-zero calibration input of the first auto-zero stage (20) or to a second input of the first output stage (39), and wherein the third output switch (31) selectively couples the first output of the second auto-zero stage (24) to a first auto-zero calibration input of the second auto-zero stage (24) or to the first input of the first output stage (39), and wherein the fourth output switch (32) selectively couples the second output of the second auto-zero stage (24) to a second auto-zero calibration input of the second auto-zero stage (24) or to the second input of the first output stage (39). The fifth output switch (52A) selectively couples the first output of the third auto-zero stage (40) to a first auto-zero calibration input of the third auto-zero stage (40) or to a first input of a second output stage (60) in the second input amplifier (12A), and wherein the sixth output switch (53A) selectively couples the second output of the third auto-zero stage (40) to a second auto-zero calibration input of the third auto-zero stage (40) or to a second input of the second output stage (60), and wherein the seventh output switch (56A) selectively couples the first output of the fourth auto-zero stage (44) to a first auto-zero calibration input of the fourth auto-zero stage (44) or to the first input of the second output stage (60), and wherein the eighth output switch (57A) selectively couples the second output of the fourth auto-zero stage (44) to a second auto-zero calibration input of the fourth auto-zero stage (44) or to the second input of the second output stage (60).

In a described embodiment, the gain circuit includes a first resistor (R1) coupled between the output (15A) of the first input amplifier (11A) and a first feedback conductor (16A), and a second resistor (R3) coupled between the output (15B) of the second input amplifier (12A) and a second feedback conductor (16B), and a third resistor (R2) coupled between the first (16A) and second (16B) feedback conductors. A fourth resistor (R4) is coupled between the output (15A) of the first input amplifier (11A) and the first input of the output amplifier (13), and a fifth resistor (R5) is coupled between the output (15B) of the second input amplifier (12A) and the second input of the output amplifier (13). A feedback resistor ($R_F$) is coupled between the output terminal (18) and the second input of the output amplifier (13). A sixth resistor (R6) is coupled between the first input of the output amplifier (13) and an AC ground.

In a described embodiment, the control circuit (70) operates various switches during the first (A), second (B), third (C) and fourth (D) phases so as to short-circuit the first and second outputs of the third auto-zero stage (40) during the first (A) phase, the first and second outputs of the first auto-zero stage (20) during the second (B) phase, the first and second outputs of the fourth auto-zero stage (44) during the third (C) phase, and the first and second outputs of the second auto-zero stage (24) during the fourth (D) phase, so as to minimize, in each case, an amount of glitch voltage occurring during a next phase.

In a described embodiment, a ninth switch (62) is coupled between the first and second inputs of the output amplifier (13) to reduce the effects on the output terminal (Vout) of a capacitively coupled glitch charge on the outputs (15A,B) of the first (11A) and second (12A) input amplifiers. The control circuit (70) briefly closes a ninth switch (62) coupled between the first and second inputs of the output amplifier (13) to reduce the effects on the output terminal (Vout) of capacitively coupled glitch charge on the outputs (15A,B) of the first (11A) and second (12A) input amplifiers.

In a described embodiment, the chopped voltage reference circuit (1A) includes first (M1) and second (M2) transistors each having a first electrode coupled to a reference voltage ($V_{DD}$) and a control electrode coupled by a first conductor (2) to a reference current source (5), a first switch (S1) having a pole coupled to the first conductor (2) during one phase and coupled by a second conductor (3) to a reference resistor (R) during a next phase, and a second switch (S2) having a pole coupled to the second conductor (3) during the one phase and coupled to the first conductor (2) during the next phase, the first (S1) and second (S2) switches and being actuated at a chopping frequency by means of the control circuit (70).

In a described embodiment, the invention provides a method of operating instrumentation amplifier circuitry including a first input amplifier (11A) having a first input receiving a first input signal ($Vin^+$), an output (15A) coupled by a gain circuit to a first input of an output amplifier (13), and a second input receiving a first feedback signal (16A) from the gain circuit, and a second input amplifier (12A) having a first input receiving a second input signal ($Vin^-$), an output (15B) coupled by the gain circuit to a second input of the output amplifier (13), and a second input receiving a second feedback signal (16B) from the gain circuit, the method including repetitively producing alternating first ($V_{REFL}$) and second ($V_{REFH}$) reference voltage levels on first (3) and second (3A) terminals of a reference circuit (1) during successive phases, respectively, auto-zeroing a first auto-zero stage (20) in the first input amplifier (11A) to the first voltage level ($V_{REFL}$), amplifying the first input signal ($Vin^+$) by means of a second auto-zero stage (24) in the first input amplifier (11A), and coupling the amplified first input signal ($Vin^+$) to the first input of the output amplifier (13), all during a first phase (A), auto-zeroing a third auto-zero stage (44) in the second input amplifier (12A) to the second voltage level ($V_{REFH}$), amplifying the second input signal ($Vin^-$) by means of a fourth auto-zero stage (40), and coupling the amplified second input signal ($Vin^-$) to the second input of the output amplifier (13), all during a second phase (B) which follows the first phase (A), auto-zeroing the second auto-zero stage (24) to the first voltage level ($V_{REFL}$), amplifying the first input signal ($Vin^+$) by means of the first auto-zero stage (20), and coupling the amplified first input signal ($Vin^+$) to the first input of the output amplifier (13), all during a third phase (C) which follows the second phase (B), and auto-zeroing the fourth auto-zero stage (40) to a the second voltage level ($V_{REFH}$), amplifying the second input signal ($Vin^-$) by means of the third auto-zero stage (44), and coupling the amplified second input signal ($Vin^-$) to the first input of the output amplifier (13), all during a fourth phase (D) which follows the third phase (C).

In one embodiment, the invention provides instrumentation amplifier circuitry including a first input amplifier (11A) having a first input receiving a first input signal ($Vin^+$), an output (15A) coupled by a gain circuit to a first input of an output amplifier (13), and a second input receiving a first feedback signal (16A) from the gain circuit, and a second input amplifier (12A) having a first input receiving a second input signal ($Vin^-$), an output (15B) coupled by the gain circuit to a second input of the output amplifier (13), and a second input receiving a second feedback signal (16B) from the gain circuit, means (1A) for repetitively producing alternating first ($V_{REFL}$) and second ($V_{REFH}$) reference voltage levels on first (3) and second (3A) terminals of a reference circuit (1) during successive phases, respectively, means (70, 21,22,25,26,28,29 etc) for auto-zeroing a first auto-zero stage (20) in the first input amplifier (11A) to the first voltage level ($V_{REFL}$), amplifying the first input signal ($Vin^+$) by means of a second auto-zero stage (24) in the first input amplifier (11A), and coupling the amplified first input signal ($Vin^+$) to the first input of the output amplifier (13), all during a first phase (A), means for auto-zeroing a third auto-zero stage (44) in the second input amplifier (12A) to the second voltage level ($V_{REFH}$), amplifying the second input signal ($Vin^-$) by means of a fourth auto-zero stage (40), and coupling the amplified second input signal ($Vin^-$) to the second input of the output amplifier (13), all during a second phase (B) which follows the first phase (A), means for auto-zeroing the second auto-zero stage (24) to the first voltage level ($V_{REFL}$), amplifying the first input signal ($Vin^+$) by means of the first auto-zero stage (20), and coupling the amplified first input signal ($Vin^+$) to the first input of the output amplifier (13), all during a third phase (C) which follows the second phase (B), and means for auto-zeroing the fourth auto-zero stage (40) to a the second voltage level ($V_{REFH}$), amplifying the second input signal ($Vin^-$) by means of the third auto-zero stage (44), and coupling the amplified second input signal ($Vin^-$) to the first input of the output amplifier (13), all during a fourth phase (D) which follows the third phase (C).

DETAILED DESCRIPTION OF THE PREFERRED EMBODIMENTS

Figure 3:
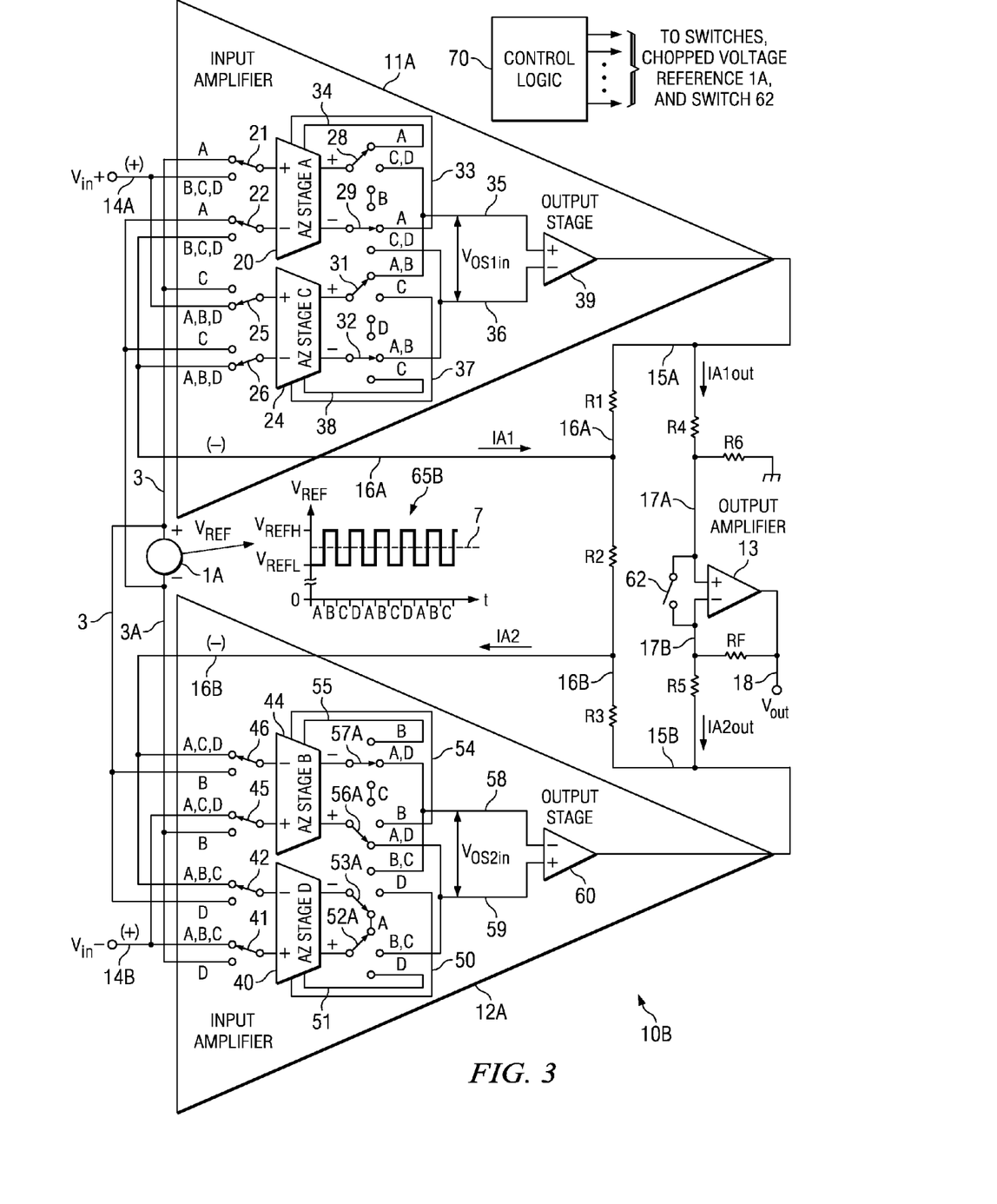
FIG. 3 is a block diagram of a 4-phase auto-zeroing instrumentation amplifier using an offset voltage reference of the kind shown in FIG. 4.

Referring to FIG. 3, four-phase auto-zeroing instrumentation amplifier 10B includes a first input amplifier 11A having a (+) input coupled by input conductor 14A to receive input signal $Vin^+$, a (−) input coupled to conductor 16A, and an output 15A coupled by a resistor R1 to conductor 16A. Instrumentation amplifier 10B also includes a second input amplifier 12A having a (+) input coupled by input conductor 14B to receive input signal $Vin^-$, a (−) input coupled to conductor 16B, and an output 15B coupled by a resistor R3 to conductor 16B. A resistor R2 is coupled between conductors 16A and 16B.

Instrumentation amplifier 10A also includes output amplifier 13 having a (+) input connected by conductor 17A to one terminal of resistor R4, which has its opposite terminal connected to output 15A of input amplifier 11A and also to one terminal of resistor R6 which has its opposite terminal connected to AC ground. Output amplifier 13 also has a (−) input connected by a conductor 17B to one terminal of resistor R5, which has its opposite terminal connected to output conductor 15B of input amplifier 12A. A switch 62 is connected between the (+) and (−) inputs of output amplifier 13. The (−) input of output amplifier 13 also is connected to one terminal of feedback resistor RF, the opposite terminal of which is connected to an output 18 of output amplifier 13. Vout is produced on conductor 18.

Instrumentation amplifier 10B also includes a four-phase chopped voltage reference circuit 1A, having a (+) terminal coupled by conductor 3 to input amplifier 11A and a (−) terminal connected by conductor 3A to input amplifier 12A. Chopped voltage reference circuit 1A produces a reference offset voltage $V_{REF}$, and can be structurally the same as the chopped voltage reference circuit 1 shown in FIGS. 1 and 2. However, chopped voltage reference circuit 1A in FIG. 3 operates to produce four phase times A, B, C and D, rather than two phase times A and B as shown in FIGS. 1 and 2.

The above described portion of FIG. 3 can be substantially the same as or identical to the corresponding portions of Prior Art FIG. 2. The structure and connections of auto-zeroing stages 20, 24, 40, and 44, and also the structure and connections of output stages 39 and 60 are similar in some respects to the corresponding blocks in Prior Art FIG. 2. However, the control logic and the control signals generated thereby to actuate the various switches and the chopped voltage reference circuit 1A in instrumentation amplifier 10B of FIG. 3 are substantially different than the corresponding elements in Prior Art FIG. 2, as subsequently explained.

In FIG. 3, auto-zeroing stage 20 of input amplifier 11A has a (+) input connected to the pole of a single pole, double throw input switch 21, and also has a (−) input coupled to the pole of a single pole, double throw input switch 22. Auto-zeroing stage 20 also has a first output coupled to the pole of a single pole, double throw output switch 28 and a second output coupled to the pole of a single pole, double throw output switch 29. The "first output" and "second output" are (+) and (−) outputs, respectively, of auto-zero stage 20. The pole of switch 21 is connected to conductor 3, i.e., the (+) terminal of $V_{REF}$ circuit 1A, during the "A" phase of a four phase auto-zero cycle of instrumentation amplifier 10B, and is connected to $Vin^+$ during the "B", "C", and "D" phases of the same for phase auto-zero cycle. Similarly, the pole of input switch 22 is connected to conductor 3A, i.e., the (−) terminal of $V_{REF}$ circuit 1A, during the "A" phase, and is connected to conductor 16A during the "B", "C", and "D" phases. The pole of output switch 28 is connected by conductor 34 to the positive auto-zero calibration input of auto-zero stage 20 during the "A" phase, is connected by conductor 35 to the (+) input of output stage 39 during the "C" and "D" phases, and is shorted to a signal zero reference or AC ground or other voltage level that will produce the lowest amount of glitch voltage during the "B" phase. In this example, the pole of output switch 28 is shorted to the pole of output switch 29 during the "B" phase, to produce a zero differential signal which is coupled to the output stage 39 during the next phase. Note that when auto-zero stage 40 in FIG. 3 begins to cause its output signal to change from zero to whatever value it will assume, that produces a glitch voltage (shown in subsequently described FIG. 5B) on the input terminals of output stage 60 which is very small compared to the much larger large glitch voltage (shown in subsequently described FIG. 4B) that appears on the input terminals of output stage 60 in Prior Art FIG. 2. Similarly, the pole of output switch 29 is connected by conductor 33 to the negative auto-zero calibration input of auto-zero stage 20 during the "A" phase, and is connected by conductor 36 to the (−) input of output stage 39 during the "C" and "D" phases.

Similarly, auto-zeroing stage 24 of input amplifier 11A has a (+) input connected to the pole of a single pole, double throw input switch 25, and also has a (−) input coupled to the pole of a single pole, double throw input switch 26. Auto-zeroing stage 24 also has a first output coupled to the pole of a single pole, double throw output switch 31 and a second output coupled to the pole of a single pole, double throw output switch 32. The pole of input switch 25 is connected to conductor $Vin^+$ during the "A", "B", and "D" phases, and is connected to conductor 3 during the "C" phase. Similarly, the pole of switch 26 is connected to conductor 16A during the "A", "B", and "D" phases, and is connected to conductor 36A during the "C" phase. The pole of switch 31 is connected by conductor 35 to the (+) input of output stage 39 during the "A" and "B" phases, is connected by conductor 37 to the positive auto-zero calibration input of auto-zero stage 24 during the "C" phase, and is short-circuited to the pole of switch 32 during the "D" phase. Similarly, the pole of output switch 32 is connected by conductor 36 to the (−) input of output stage 39 during the "A" and "B" phases and is connected by conductor 38 to the negative auto-zero calibration input of auto-zero stage 24 during the "C" phase.

Similarly, auto-zeroing stage 44 of input amplifier 12A has a (+) input connected to the pole of a single pole, double throw input switch 45, and also has a (−) input coupled to the pole of a single pole, double throw input switch 46. Auto-zeroing stage 44 also has a first output coupled to the pole of a single pole, double throw output switch 57A, and a second output coupled to the pole of a single pole, double throw output switch 56A. The pole of switch 21 is connected to conductor 16B during the "A", "C", and "D" phases, and is connected to conductor 3 during the "B", phase. Similarly, the pole of switch 45 is connected to Vin⁻ during the "A" phase, and is connected to conductor 3A during the "B" phase. The pole of output switch 57A is connected by conductor 58 to the (−) input of output stage 60 during the "A" and "B" phases, is connected by conductor 55 to the positive auto-zero calibration input of auto-zero stage 44 during the "B" phase, and is short-circuited to the pole of switch 56A during the "C" phase. Similarly, the pole of output switch 56A is connected by conductor 59 to the (+) input of output stage 60 during the "A" and "D" phases and is connected by conductor 54 to the negative auto-zero calibration input auto-zero stage 44 during the "B" phase.

Similarly, auto-zeroing stage 40 of input amplifier 12A has a (+) input connected to the pole of a single pole, double throw input switch 41, and also has a (−) input coupled to the pole of a single pole, double throw input switch 42. Auto-zeroing stage 40 also has a first output coupled to the pole of a single pole, double throw output switch 52A and a second output coupled to the pole of a single pole, double throw output switch 53A. The pole of input switch 45 is connected to conductor Vin⁻ during the "A", "C", and "D" phases, and is connected to conductor 3A during the "B" phase. Similarly, the pole of input switch 46 is connected to conductor 16B during the "A", "C", and "D" phases, and is connected to conductor 3 during the "B" phase. The pole of output switch 53A is connected by conductor 58 to the (−) input of output stage 60 during the "B" and "C" phases, is connected by conductor 50 to the positive auto-zero calibration input of auto-zero 40 stage during the "D" phase, and is short-circuited to the pole of switch 52A during the "A" phase. Similarly, the pole of output switch 52A is connected by conductor 59 to the (+) input of output stage 60 during the "B" and "C" phases and is connected by conductor 51 to the negative auto-zero calibration input of auto-zero stage 40 during the "D" phase.

Figure 4A:
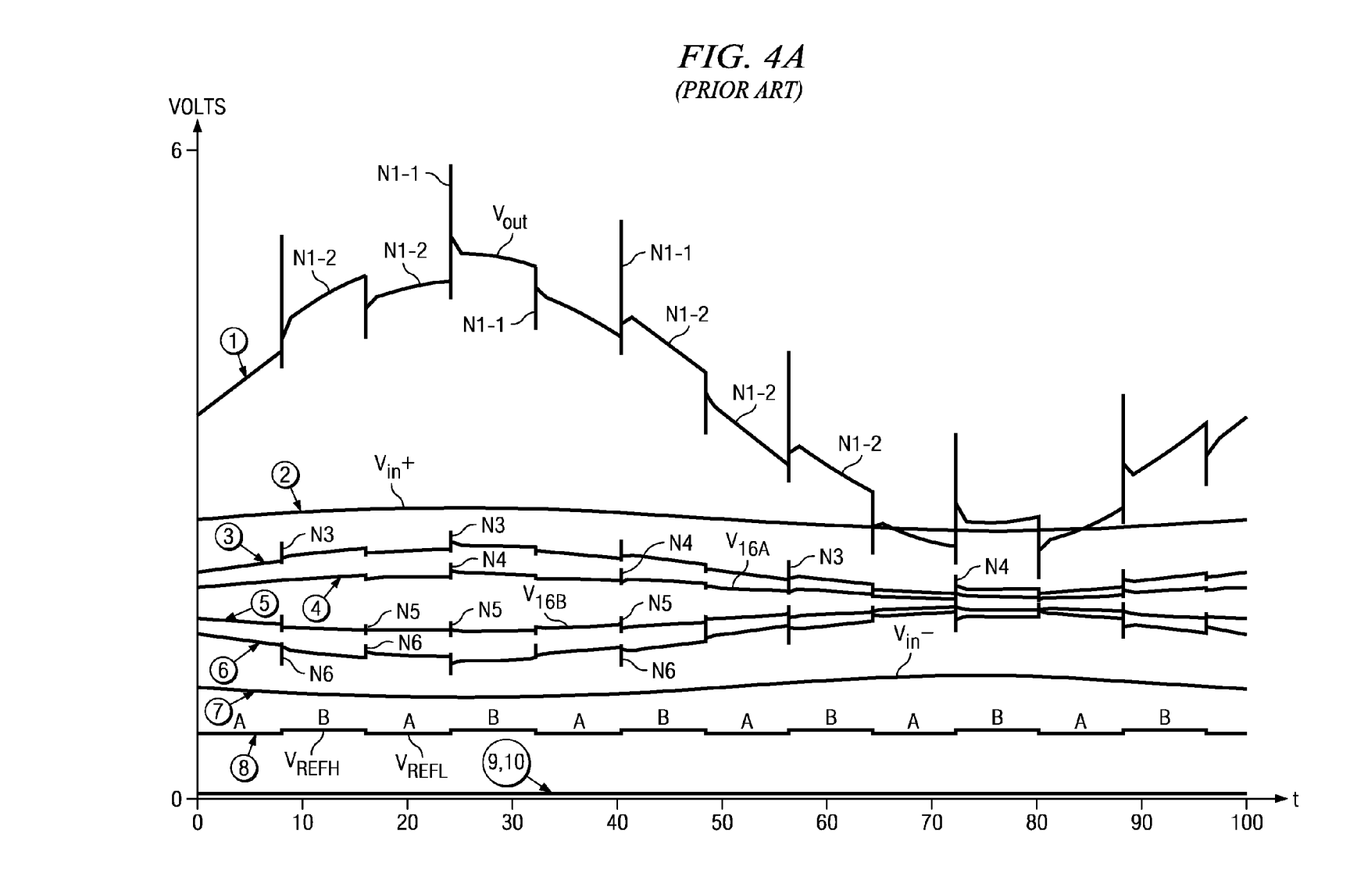
FIGS. 4A and 4B show waveforms which are useful in understanding the harmful glitch voltages in the prior art instrumentation amplifier of FIG. 2.
Figure 4B:
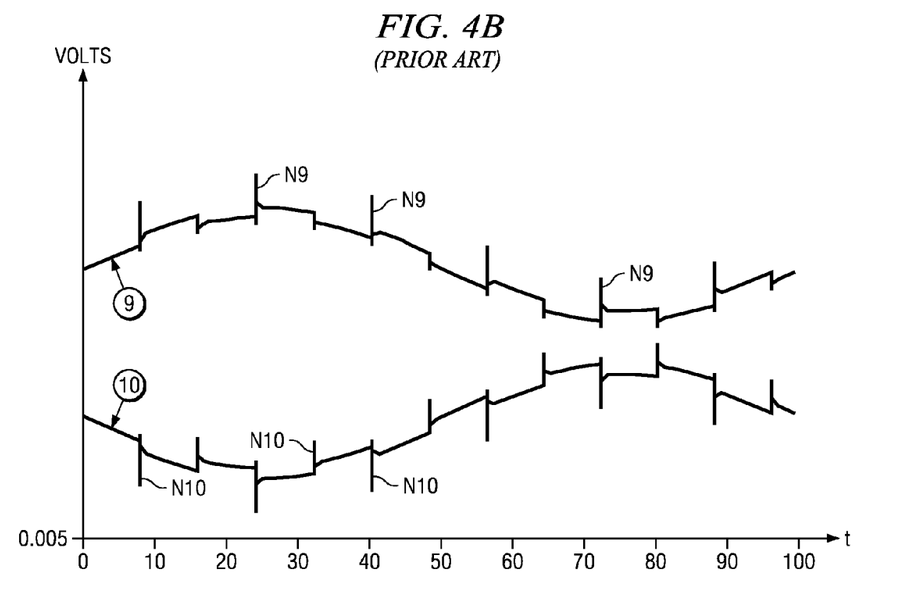
Figure 5A:
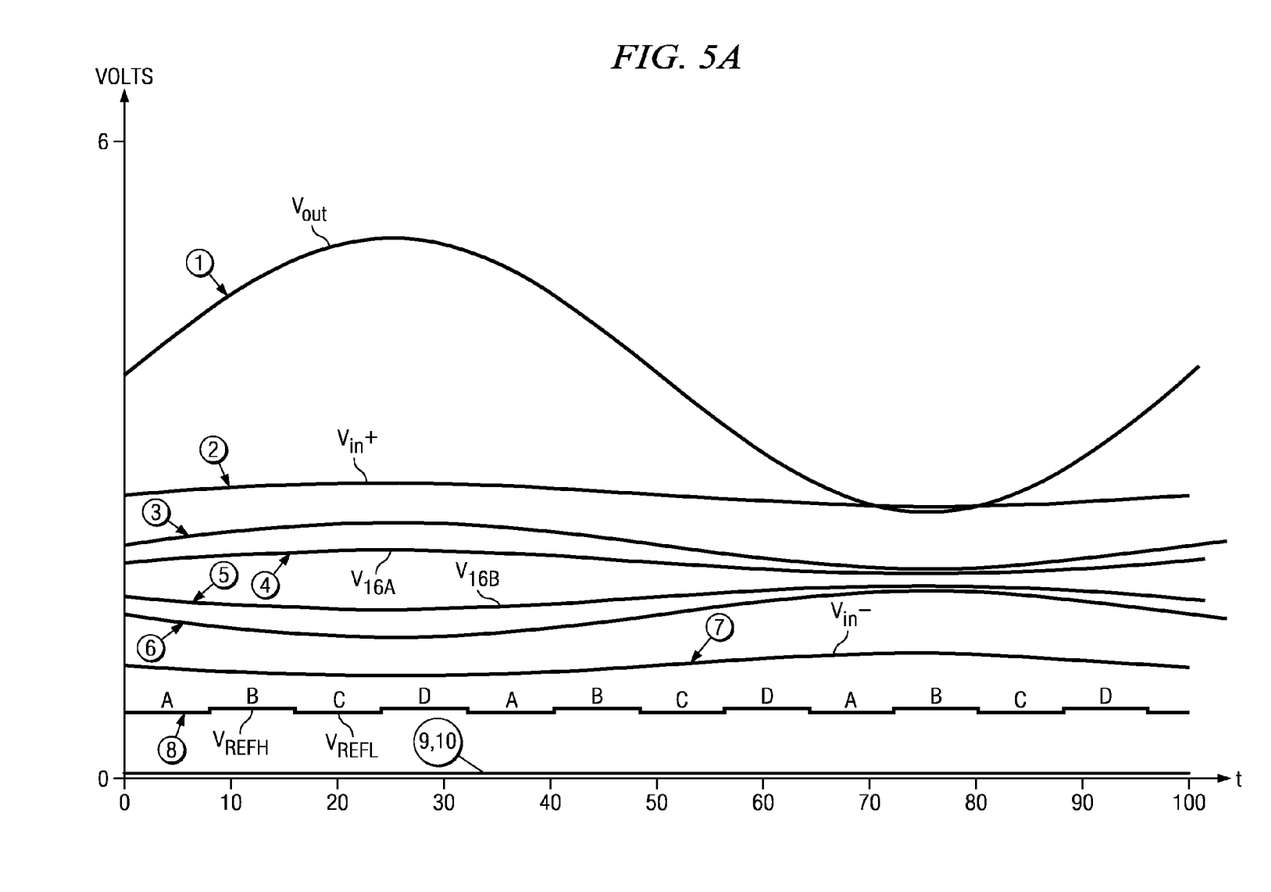
FIGS. 5A and 5B show waveforms corresponding to those in FIGS. 4A and 4B which are useful in understanding how the instrumentation amplifier of FIG. 3 substantially eliminates the harmful glitch voltages that occur in the prior art instrumentation amplifier of FIG. 2.
Figure 5B:
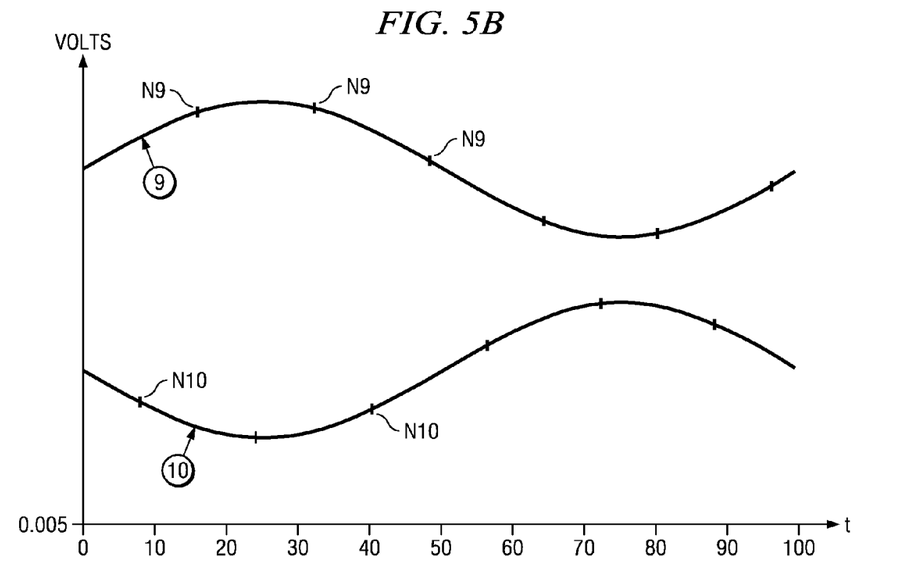

FIGS. 4A and 4B show waveforms generated from simulation data for instrumentation amplifier 10A Prior Art FIGS. 2 and 5A,B and FIGS. 5A and 5B show comparable waveforms generated from simulation data for instrumentation amplifier 10B of FIG. 3. Waveform 8 in each case shows the alternating levels $V_{REFH}$ and $V_{REFL}$ of the output $V_{REF}$ produced by the chopped voltage reference circuits, with the two phases A and B of each auto-zero cycle for FIG. 2 being labeled in FIG. 4A and the four phases A, B, C and D for each auto-zero cycle for FIG. 3 being labeled in FIG. 5A. The variation between $V_{REFH}$ and $V_{REFL}$ may be a few percent appearing of the average or DC component of $V_{REF}$ about 0.5 volts. Waveforms 2 and 7 represent Vin⁺ and Vin⁻ in each case. The noise glitches that are produced in response to the transitions between the $V_{REFH}$ and $V_{REFL}$ levels of the $V_{REF}$ waveform are represented by N1–1 on waveform 1, by N3 on waveform 3, by N4 on waveform 4, etc. The "sharp" glitches N–1 and N3 are produced by the output of the auto-zero stage switching between its calibration level and the signal-carrying level, and are not produced by phase A transitioning to phase B or vice versa. Those sharp glitches are substantially reduced by shorting the outputs of each auto-zero stage to zero, i.e., together. The different voltage levels, rather than the minute transitions, in $V_{REF}$ show up as a square wave, designated by reference numerals N1–2, being superimposed on Vout, as shown in FIG. 4A. That is the previously mentioned clock feed-through glitch. The sharp glitches N1–1 and N3 of the ones that are removed as a result of the first and second outputs of the various auto-zero stages being briefly shorted to each other or to an AC ground.

The difference voltage between Vin⁺ and Vin⁻ in FIG. 2 can be represented as a small-amplitude sine wave signal superimposed on a substantially larger DC offset voltage between Vin⁺ and Vin⁻. Prior Art instrumentation amplifier 10A operates to subtract the present value of $V_{REF}$, i.e., either $V_{REFH}$ or $V_{REFL}$, from Vin⁺ and Vin⁻ in order to reduce the DC offset, so that instrumentation amplifier 10A can amplify only the relatively small AC portion of input signal Vin⁺−Vin⁻. The voltage difference between Vin⁺ and waveform 4 in FIG. 4A should be exactly equal to the present value of $V_{REF}$. Waveform 4 represents the voltage on conductor 16A which is fed back to the (−) input of input amplifier 11 in FIG. 2.

Similarly, the voltage difference between Vin⁻ and waveform 5 is the offset $V_{REF}$ added to Vin⁻ conductor 14B to obtain the voltage on conductor 16B. The voltage difference between waveform 4 and waveform 5 is the remaining signal, which appears across resistor R2.

The ratios between resistor R1 and R2 and between R3 and R2 set the gain for instrumentation amplifier 10A, so the voltage difference between waveforms 4 and 5 is gained up by those resistor ratios to produce the input amplifier output voltages on conductors 15A and 15B, which are represented by waveforms 3 and 6, respectively. Therefore, it can be seen from the Vout waveform (waveform 1) that the AC portion of the amplified signal has been gained up substantially from the input voltages Vin⁺ and Vin⁻. However, the glitch voltage levels from resulting from the transitions between $V_{REFH}$ and $V_{REFL}$ levels of the $V_{REF}$ waveform also are gained up by about the same amount.

The superimposed square wave glitches due to the square wave feature of the $V_{REF}$ waveform in FIG. 1A, referred to herein as the clock feed-through glitches, are the result of the square wave portion of the $V_{REF}$ waveform being amplified. The technique of the present invention including always sampling $V_{REFH}$ in the auto-zeroing processes in one input amplifier and always sampling $V_{REFL}$ in the auto-zeroing processes in the other input amplifier completely eliminates the level shifts or glitches N1–2 shown in Prior Art FIG. 4A, as can be seen by comparing it with the Vout waveform shown in FIG. 5A. That is the most important aspect of the described inventions herein, as it pertains to offset-canceling instrumentation amplifiers of the kind shown in FIG. 3.

In another aspect of the present invention, the narrow or sharp voltage spikes or glitches N1–1, N3, N9 and N10 are substantially reduced by zeroing the output of an auto-zero stage during one of the phases A, B, C or D. What remains, labeled N9 and N10 in FIG. 5B, are the results of the auto-zero output voltages going from zero to the appropriate amplified signal level at that point, are removed by very short closures of switch 62. The reduction from the relatively large levels indicated by N9 and N10 in FIG. 4B to the very small levels indicated by N9 and N10 in FIG. 5B is due to the output being zeroed during one of the phases. That is, the Vout waveform in FIG. 5A is very clean because the glitches N9 and N10 are cleaned up by switch 62. The benefit of zeroing the outputs of the auto-zero stages by shorting them together is more important in the case of offset-canceling instrumentation amplifiers than the benefit of short-circuiting inputs of output amplifier 13. However, the technique of short-circuiting the inputs of output amplifier 13 is widely applicable to many kinds of auto-zeroing amplifiers other than offset-canceling amplifiers and may be very beneficial in some cases, at very little additional cost. The benefit of zeroing the outputs of the auto-zero stages by shorting them together also may be beneficial in auto-zeroing amplifiers other than offset-canceling auto-zeroing amplifiers, but obtaining this benefit will require additional costs of additional circuitry and more complex timing.

The voltages on conductors 15A and 15B are amplified through a standard operational amplifier configuration including output amplifier 13 to provide the output voltage Vout, which includes an AC signal component which has been amplified significantly, with much of the DC removed from it. However, the somewhat square steps that appear to be superimposed on Vout waveform 1 in Prior Art FIG. 4A all are caused by the small alternating square wave steps of the $V_{REF}$ waveform 8, produced by chopped voltage reference source 1.

Waveforms 9 and 10 represent the voltages between the (+) and (−) inputs of the two output stages 39 and 60, namely Vos1in and Vos2in in FIG. 2. These two voltages are shown in an expanded vertical scale as waveform 9 and waveform 10 in Prior Art FIG. 4B, wherein the previously mentioned highly amplified noise voltage glitches or spikes N9 and N10 reach the inputs of output stages 39 and 60 and are very evident.

FIGS. 5A and 5B show waveforms 1-10 generated by instrumentation amplifier 10B of the present invention shown in FIG. 3. These waveforms correspond to, and are shown at the same vertical scale as, those described above. Note that the glitches represented by the transitions between the alternating levels $V_{REFH}$ and $V_{REFL}$ produced by the $V_{REF}$ chopped voltage reference circuit 1A in FIG. 3 are present in FIG. 5A, with the same amplitude as in Prior Art FIG. 4A. However, in accordance with the present invention, the amplified glitches in instrumentation amplifier 10B of FIG. 3 corresponding to the much larger glitches on the various other corresponding waveforms shown in Prior Art FIGS. 4A and 4B are completely eliminated or are just barely visible in FIGS. 5A and 5B. The difference voltage between waveform 2 and waveform 4 is constant, and the difference voltage between waveform 7 and waveform 5 is slightly different in FIG. 5B, and provides a smooth signal that gets amplified up and does not have appreciably large glitch voltages superimposed on it. The glitches that appear on waveforms 3 and 6 and FIG. 5A are of greatly diminished amplitude compared to the corresponding glitches in Prior Art FIG. 4A. Those glitches are a result of the output voltages of the auto-zero stages going to the desired signal level after first having been shorted to ground. Although the circuitry in instrumentation amplifier 10B of the present invention does not entirely remove those glitches, as shown in FIG. 5B, they are significantly smaller in amplitude from the corresponding glitches shown in Prior Art FIG. 4B.

Control logic 70 generates the various switch control signals to activate all of the switches in input amplifier 11B and input amplifier 12A, and also generates the chopping clock signal required for chopped voltage reference circuit 1A to cause them to operate in the subsequently described manner described above.

As mentioned above, chopped voltage reference circuit 1A in FIG. 3 provides four phases A, B, C, and D for each auto-zeroing cycle of instrumentation amplifier 10B, in contrast to chopped voltage reference circuit 1 in Prior Art FIG. 2 which provides only two phases A and B for each auto-zeroing cycle of instrumentation amplifier 10A.

Instrumentation amplifier 10B of FIG. 3 includes a combination of four closely related circuit improvements which together avoid the above-mentioned problems of prior art instrumentation amplifier 10A of FIG. 2.

First, the chopping frequency of the offset reference circuit 1A is doubled relative to the frequency of the auto-zero stage cycle of instrumentation amplifier 10B in FIG. 3. In four-phase instrumentation amplifier 10B of FIG. 3, a complete auto-zero cycle requires the above mentioned four time periods, labeled A, B, C and D, during which time offset voltage generator 1A goes through two complete chopping cycles. In other words, the chopped voltage reference circuit 1A goes through two complete "prior art" cycles (i.e., a "A-B" cycle and then a "C-D" cycle which is exactly the same as an "A-B" cycle in the prior art) for every one auto-zero cycle of the auto-zero amplifier. (In contrast, the two auto-zero stages 20 and 40 labeled "A" in Prior Art FIG. 2 are simultaneously auto-zeroed with respect to the lower reference voltage value $V_{REFL}$ during time period or phase A, while the two auto-zero stages 24 and 44 labeled "B" are simultaneously auto-zeroed to the upper reference voltage value $V_{REFH}$ during time period or phase B, so, a complete auto-zero cycle occurs in the same time period as, and at the same frequency as, a complete reference circuit chopping cycle.)

The second change provided in instrumentation amplifier 10B of FIG. 3 involves calibrating each of the auto-zero stages 20, 24, 40 and 44 individually, instead of two at a time as in the prior art circuit of FIG. 2. This is made possible because the auto-zero cycle of instrumentation amplifier 10B of FIG. 3 includes the four time periods A, B, C and D (instead of just two time periods A and B as in Prior Art FIG. 2). The order of the auto-zero calibration operation in instrumentation amplifier 10B of FIG. 3 also is arranged so that both auto-zero input stages of a single input amplifier 11A or 12A are calibrated to the chopped voltage reference circuit 1A during separate but similar chopping phases. For example, the chopped reference voltage $V_{REF}$ is at the same level during time periods A and C. In FIG. 3, $V_{REF}$ is assumed to be lower than the average reference voltage (i.e., lower than the average reference voltage indicated by reference numeral 7 in FIG. 1A). The reference voltage assumes the other level above the average during periods B and D. Therefore, the two auto-zero stages 20 and 24 in input amplifier 11A are calibrated during time periods A and C, while $V_{REF}$ is low. Similarly, the auto-zero stages 40 and 44 in input amplifier 12A are auto-zeroed during time periods B and D when the $V_{REF}$ reference is at the opposite high voltage level above the average.

Since both auto-zero stages in a particular input amplifier are always auto-zeroed to the reference $V_{REF}$ while it is in the same state, the output of that input amplifier 11A or 12A does not change when the auto-zero stages are swapped. Note that the outputs 15A and 15B of the two input amplifiers 11A and 12A, respectively, contain equal and opposite errors related to the alternating error component of the chopped voltage reference $V_{REF}$, and that these are DC output errors and therefore cancel each other at the input of output amplifier 13.

In contrast, the prior art instrumentation amplifier 10A of FIG. 2 calibrates one auto-zero stage in each of input amplifiers 11 and 12 during time period A, and then calibrates the other auto-zero stage in each of input amplifiers 11 and 12 during time period B. Therefore the two auto-zero stages contained in each input amplifier in the prior art circuit are always calibrated to the chopped voltage reference $V_{REF}$ at alternate voltage levels. This causes the output signals on conductors 15A and 15B of input amplifiers 11 and 12 in Prior Art FIG. 2 to vary in accordance with the chopped voltage reference levels of $V_{REF}$. To make things worse, these errors in Prior Art FIG. 2 reinforce each other at the input of the output amplifier 13 and produce a clock feed-through glitch or voltage spike twice as large as either input amplifier 11 or 12 would produce alone.

A third circuit improvement provided by the present invention introduces an "idle state" during which each of auto-zero input stages 20, 25, 40 and 44 has its output shorted to a zero-signal reference or AC ground before it is connected to output stage 39 or 40 to carry the signal being amplified. The idle state is seen as applied to the auto-zero stage 40 labeled "D" of input amplifier 12A in FIG. 3. Auto-zeroing stage 40 will have completed its calibration function in the previous phase D time period and is next in line to be connected as the signal-carrying stage at the beginning of phase B. The outputs of auto-zero stage 40 are shorted together during phase A in order to discharge the signal charge, stage charge, and offset-related charge that exists on the parasitic capacitance associated with the outputs of stage 40. By eliminating these charges during phase A, they do not contribute to a glitch when auto-zero stage 40 begins carrying the amplified signal during phase B.

A fourth circuit improvement provided in instrumentation amplifier 10B of FIG. 3 is switch 62 connected between the inputs of amplifier 13. Switch 62 is closed for a very short time during the transitions between the various phases A, B, C and D for input amplifiers 11A and 11B. The differential input to amplifier 13 should always be close to zero (i.e., a virtual short circuit) due to the feedback and high gain of amplifier 13. Closing switch 62 during the transitions between the various phases ensures that capacitively coupled glitches from outputs 15A and 15B of input amplifiers 11A and 11B do not produce large disturbances that subsequently produced disturbances in Vout.

Thus, instrumentation amplifier 10B of the present invention differs from the prior art by providing four phases rather than two, during which auto-zero calibration is performed so that each auto-zero stage is calibrated individually, in contrast to the prior art in which auto-zero stages are calibrated two at a time. Both of the auto-zero stages in each input amplifier are calibrated to the same chopped a voltage reference offset signal, whereas in the prior art one auto-zero amplifier is calibrated to the "high" output level of the chopped voltage reference circuit and the other auto-zero amplifier in the same input amplifier is calibrated to the "low" output level of the chopped voltage reference circuit. In accordance with the present invention, each auto-zero stage cycles through three distinct periods, namely a "calibrate" period, an "output short circuit" period, and a "pass signal" period, in contrast to the prior art of FIG. 2 wherein the auto-zero amplifiers cycle through only two periods, namely a "calibrate" period and a "pass signal" period. Furthermore, in the instrumentation amplifier architecture of the present invention the chopper frequency is twice the frequency of the auto-zero cycle, in contrast to the prior art wherein the chopper frequency is the same as the frequency of the auto-zero cycle. Also, the auto-zero stage outputs in instrumentation amplifier 10A of FIG. 3 are reset to zero before passing the amplified signal to output stage 13, and the "virtual short-circuit" inputs of output stage 13 are subjected to a true short-circuit by switch 62 for a very brief time interval to dissipate any glitch energy, whereas neither of these features are provided in the prior art of FIG. 2.

Instrumentation amplifier 10B of FIG. 3 provides the advantages of eliminating both the "chopped-current-source-induced output glitch" (also referred to herein as a "clock feed-through glitch") and the random mismatch-induced output glitches as well as much of the capacitively coupled transition glitch energy while maintaining high accuracy and low thermal drift of the instrumentation amplifier. Because both auto-zero stage inputs of input amplifier 11A and 12A are calibrated to the same chopped voltage reference level $V_{REF}$, the level of Vout experiences no voltage glitch when the two input amplifiers are switched. Each input amplifier is calibrated to the same reference level $V_{REF}$, which may have a slight error. However, the average reference voltage levels generated during the four phases is very accurate and does not drift appreciably because it was generated by a chopped current reference source. Since one input amplifier 11A or 12A is calibrated to one of the reference levels and the other input amplifier is calibrated to the corresponding opposite level, the input offset voltage of instrumentation amplifier 10B of FIG. 3 is in effect calibrated to the above mentioned very stable, accurate average offset reference voltage. To the extent that the input amplifiers 11A and 11B and output amplifier 13 are linear, there is minimal error due to the alternating chopping levels. Furthermore, since each auto-zero stage output is shorted to zero during the time period before it is connected to the inputs of output stage 13, there is no mismatch-dependent signal error coupled to output amplifier 13. Note that the "extra" idle time period used to short-circuit the outputs of the two input amplifiers is a result of dividing the auto-zero cycle into the four time periods or phases as described above. However, the idle time period need only be long enough to discharge the auto-zero stage output capacitance. Therefore, the technique of short-circuiting the outputs of an auto-zero stage may be applied with benefit to any auto-zero amplifier by providing a very short "extra" idle time in which to perform the short-circuit. Finally, the transition-related capacitively coupled glitch charge is largely dissipated in the "virtual short" short-circuiting switch 62 before it can produce any persisting transient output errors. The improved glitch performance allows instrumentation amplifier 10B to be used in low noise systems in which the prior art instrumentation amplifier 10A of FIG. 2 has proven to be unsatisfactory.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, in some cases, it may be practical to provide an instrumentation amplifier structure in which the output 15A of input amplifier 11A and the output 15B of input amplifier 12A in FIG. 3 are connected directly to the two inputs of a differential ADC without use of output amplifier 13.

Also, in some cases it may be practical to provide an instrumentation amplifier which omits the above described output amplifier 13 and associated gain circuitry. In one such configuration, a first operational amplifier such as input amplifier 11A in FIG. 3 would have its (+) input coupled to Vin⁺ and a second operational amplifier such as input amplifier 12A in FIG. 3 would have its (+) input coupled to Vin⁻. The (−) input of the first operational amplifier would be coupled by a first resistor to the output of the second operational amplifier. The (−) input of the first amplifier could be coupled by an optional second resistor to the (−) input of a second operational amplifier. The output of each operational amplifier would be coupled by a separate feedback resistor to the (−) input of that operational amplifier. The (−) input of the second operational amplifier would be coupled to a reference voltage by another resistor. The output of the first operational amplifier would be the output of the instrumentation amplifier.

What is claimed is:

1. Instrumentation amplifier circuitry comprising:
first and second input amplifiers each having a first input, a second input, and an output, a chopped voltage reference circuit producing alternating first and second reference voltage levels on first and second terminals thereof;
first and second auto-zero stages, first, second, third and fourth input switches, and first, second, third and fourth output switches in the first input amplifier;
third and fourth auto-zero stages, fifth, sixth, seventh and eighth input switches, and fifth, sixth, seventh and eighth output switches in the second input amplifier; and
a control circuit for generating various control signals to control the chopped voltage reference circuit, various input switches, and various output switches;
wherein the control circuit operates the various input switches and the various output switches during first, second, third and fourth phases so as to auto-zero the first auto-zero stage to the first voltage level during the first phase, auto-zero the third auto-zero stage to the second voltage level during the second phase, auto-zero the second auto-zero stage to the first voltage level during the third phase, and auto-zero the fourth auto-zero stage to the second voltage level during the fourth phase.

2. The instrumentation amplifier circuitry of claim 1 including an output amplifier having first and second input terminals and an output terminal, and gain circuitry coupling a first output of the first input amplifier and a second output of the second input amplifier to the first and second inputs, respectively, of the output amplifier.

3. The instrumentation amplifier circuitry of claim 2 wherein the control circuit also operates the various output switches to amplify the first input signal by means of the second auto-zero stage and couple the amplified first input signal to the first input of the output amplifier during the first phase, to amplify the second input signal by means of the fourth auto-zero stage and couple the amplified second input signal to the second input of the output amplifier during the second phase, to amplify the first signal by means of the first auto-zero stage and couple the amplified first input signal to the first input of the output amplifier during the third phase, and amplify the second input signal by means of the third auto-zero stage and couple the amplified second input signal to the first input of the output amplifier during the fourth phase.

4. The instrumentation amplifier circuitry of claim 2 wherein the first input of the first input amplifier is coupled to receive a first input signal and the first input of the second input amplifier is coupled to receive a second input signal, and wherein the first input switch selectively couples the first input of the first auto-zero stage to the first input signal or the first terminal of the chopped reference voltage circuit, and wherein the second input switch selectively couples the second input of the first auto-zero stage to the second terminal of the chopped reference voltage circuit or to a first feedback conductor of the gain circuitry, and wherein the third input switch selectively couples the first input of the second auto-zero stage to the first input signal or the first terminal of the chopped reference voltage circuit, and wherein the fourth input switch selectively couples the second input of the second auto-zero stage to the second terminal of the chopped reference voltage circuit or to the first feedback conductor of the gain circuitry.

5. The instrumentation amplifier circuitry of claim 4 wherein the fifth input switch selectively couples the first input of the third auto-zero stage to the second input signal or the second terminal of the chopped reference voltage circuit, and wherein the sixth input switch selectively couples the second input of the third auto-zero stage to the first terminal of the chopped reference voltage circuit or to a second feedback conductor of the gain circuitry, and wherein the seventh input switch selectively couples the first input of the fourth auto-zero stage to the second input signal or the second terminal of the chopped reference voltage circuit, and wherein the eighth input switch selectively couples the second input of the fourth auto-zero stage to the first terminal of the chopped reference voltage circuit or to the second feedback conductor of the gain circuitry.

6. The instrumentation amplifier circuitry of claim 1 wherein the first output switch selectively couples the first output of the first auto-zero stage to a first auto-zero calibration input of the first auto-zero stage or to a first input of a first output stage in the first input amplifier, and wherein the second output switch selectively couples the second output of the first auto-zero stage to a second auto-zero calibration input of the first auto-zero stage or to a second input of the first output stage, and wherein the third output switch selectively couples the first output of the second auto-zero stage to a first auto-zero calibration input of the second auto-zero stage or to the first input of the first output stage, and wherein the fourth output switch selectively couples the second output of the second auto-zero stage to a second auto-zero calibration input of the second auto-zero stage or to the second input of the first output stage.

7. The instrumentation amplifier circuitry of claim 6 wherein the fifth output switch selectively couples the first output of the third auto-zero stage to a first auto-zero calibration input of the third auto-zero stage or to a first input of a second output stage in the second input amplifier, and wherein the sixth output switch selectively couples the second output of the third auto-zero stage to a second auto-zero calibration input of the third auto-zero stage or to a second input of the second output stage, and wherein the seventh output switch selectively couples the first output of the fourth auto-zero stage to a first auto-zero calibration input of the fourth auto-zero stage or to the first input of the second output stage, and wherein the eighth output switch selectively couples the second output of the fourth auto-zero stage to a second auto-zero calibration input of the fourth auto-zero stage or to the second input of the second output stage.

8. The instrumentation amplifier circuitry of claim 2 wherein the gain circuit includes a first resistor coupled between the output of the first input amplifier and a first feedback conductor, and a second resistor coupled between the output of the second input amplifier and a second feedback conductor, and a third resistor coupled between the first and second feedback conductors.

9. The instrumentation amplifier circuitry of claim 8 including a fourth resistor coupled between the output of the first input amplifier and the first input of the output amplifier, and a fifth resistor coupled between the output of the second input amplifier and the second input of the output amplifier.

10. The instrumentation amplifier circuitry of claim 9 including a feedback resistor coupled between the output terminal and the second input of the output amplifier.

11. The instrumentation amplifier circuitry of claim 9 wherein including a sixth resistor coupled between the first input of the output amplifier and an AC ground.

12. The instrumentation amplifier circuitry of claim 2 wherein the control circuit operates various switches during the first, second, third and fourth phases so as to short-circuit the first and second outputs of the third auto-zero stage during the first phase, the first and second outputs of the first auto-zero stage during the second phase, the first and second outputs of the fourth auto-zero stage during the third phase, and the first and second outputs of the second auto-zero stage during the fourth phase, so as to minimize, in each case, an amount of glitch voltage occurring during a next phase.

13. The instrumentation amplifier circuitry of claim 2 including a ninth switch coupled between the first and second inputs of the output amplifier to reduce the effects on the output terminal of a capacitively coupled glitch charge on the outputs of the first and second input amplifiers.

14. The instrumentation amplifier circuitry of claim 13 wherein the control circuit briefly closes the ninth switch during transitions between the various phases.

15. The instrumentation amplifier circuitry of claim 12 wherein the control circuit operates a ninth switch coupled between the first and second inputs of the output amplifier to reduce the effects on the output terminal of capacitively coupled glitch charge on the outputs of the first and second input amplifiers.

16. The instrumentation amplifier circuitry of claim 1 wherein the chopped voltage reference circuit includes first and second transistors each having a first electrode coupled to a reference voltage and a control electrode coupled by a first conductor to a reference current source, a first switch having a pole coupled to the first conductor during one phase and coupled by a second conductor to a reference resistor during a next phase, and a second switch having a pole coupled to the second conductor during the one phase and coupled to the first conductor during the next phase, the first and second switches and being actuated at a chopping frequency by means of the control circuit.

17. A method of operating instrumentation amplifier circuitry including a first input amplifier having a first input receiving a first input signal, a first output, and a second input receiving a first feedback signal from the gain circuit, and a second input amplifier having a first input receiving a second input signal, a second output, and a second input receiving a second feedback signal from the gain circuit, the method comprising:
  repetitively producing alternating first and second reference voltage levels on first and second terminals of a reference circuit during successive phases, respectively;
  auto-zeroing a first auto-zero stage in the first input amplifier to the first voltage level, amplifying the first input signal by means of a second auto-zero stage in the first input amplifier, and coupling the amplified first input signal to the first output, all during a first phase;
  auto-zeroing a third auto-zero stage in the second input amplifier to the second voltage level, amplifying the second input signal by means of a fourth auto-zero stage in the second input amplifier, and coupling the amplified second input signal to the second output, all during a second phase which follows the first phase;
  auto-zeroing the second auto-zero stage to the first voltage level, amplifying the first input signal by means of the first auto-zero stage, and coupling the amplified first input signal to the first output, all during a third phase which follows the second phase; and
  auto-zeroing the fourth auto-zero stage to a the second voltage level, amplifying the second input signal by means of the third auto-zero stage, and coupling the amplified second input signal to the second output, all during a fourth phase which follows the third phase.

18. The method of claim 17 wherein the instrumentation amplifier circuitry includes an output amplifier having a first input coupled by a gain circuit to the first output and a second input coupled by the gain circuit to the second output, wherein the step of auto-zeroing the first auto-zero stage in the first input amplifier to the first voltage level, amplifying the first input signal by means of the second auto-zero stage in the first input amplifier, and coupling the amplified first input signal to the first output, all during the first phase includes coupling the amplified first input signal to the first input of the output amplifier during the first phase, the step of auto-zeroing the third auto-zero stage in the second input amplifier to the second voltage level, amplifying the second input signal by means of the fourth auto-zero stage in the second input amplifier, and coupling the amplified second input signal to the second output, all during the second phase which follows the first phase includes coupling the amplified second input signal to the second input of the output amplifier during the second phase, the step auto-zeroing the second auto-zero stage to the first voltage level, amplifying the first input signal by means of the first auto-zero stage, and coupling the amplified first input signal to the first output, all during the third phase which follows the second phase includes coupling the amplified first input signal to the first input of the output amplifier during the third phase, and the step of auto-zeroing the fourth auto-zero stage to the second voltage level, amplifying the second input signal by means of the third auto-zero stage, and coupling the amplified second input signal to the second output, all during the fourth phase which follows the third phase includes coupling the amplified second input signal to the second input of the output amplifier during the fourth phase.

19. Instrumentation amplifier circuitry comprising:
  a first input amplifier having a first input receiving a first input signal, a first output, and a second input receiving a first feedback signal from the gain circuit, and a second input amplifier having a first input receiving a second input signal, a second output, and a second input receiving a second feedback signal;
  means for repetitively producing alternating first and second reference voltage levels on first and second terminals of a reference circuit during successive phases, respectively;
  means for auto-zeroing a first auto-zero stage in the first input amplifier to the first voltage level, amplifying the first input signal by means of a second auto-zero stage in the first input amplifier, and coupling the amplified first input signal to the first output, all during a first phase;
  means for auto-zeroing a third auto-zero stage in the second input amplifier to the second voltage level, amplifying the second input signal by means of a fourth auto-zero stage, and coupling the amplified second input signal to the second output, all during a second phase which follows the first phase;
  means for auto-zeroing the second auto-zero stage to the first voltage level, amplifying the first input signal by means of the first auto-zero stage, and coupling the amplified first input signal to the first output, all during a third phase which follows the second phase; and
  means for auto-zeroing the fourth auto-zero stage to a the second voltage level, amplifying the second input signal by means of the third auto-zero stage, and coupling the amplified second input signal to the second output, all during a fourth phase which follows the third phase.

20. The instrumentation amplifier circuitry of claim 19 wherein the instrumentation amplifier circuitry includes an output amplifier having a first input coupled by a gain circuit to the first output and a second input coupled by the gain circuit to the second output, means for coupling the amplified first input signal to the first input of the output amplifier during the first phase, means for coupling the amplified second input signal to the second input of the output amplifier during the second phase, means for coupling the amplified first input signal to the first input of the output amplifier during the third phase, and means for coupling the amplified second input signal to the second input of the output amplifier during the fourth phase.

\* \* \* \* \*